US012690413B2

(12) United States Patent
Voleti et al.

(10) Patent No.: US 12,690,413 B2
(45) Date of Patent: Jul. 21, 2026

(54) LARGE FORMAT CONTINUOUS IMAGING SYSTEM

(71) Applicant: Applied Materials, Inc., Santa Clara, CA (US)

(72) Inventors: Venkatakaushik Voleti, San Jose, CA (US); Mehdi Vaez-Iravani, Los Gatos, CA (US)

(73) Assignee: Applied Materials Inc., Santa Clara, CA (US)

( * ) Notice: Subject to any disclaimer, the term of this patent is extended or adjusted under 35 U.S.C. 154(b) by 222 days.

(21) Appl. No.: 18/234,591

(22) Filed: Aug. 16, 2023

(65) Prior Publication Data

US 2025/0062145 A1 Feb. 20, 2025

(51) Int. Cl.
*H01L 21/67* (2006.01)
*G06T 7/00* (2017.01)
*G06T 7/73* (2017.01)
*H10P 72/00* (2026.01)

(52) U.S. Cl.
CPC ........ *H10P 72/0616* (2026.01); *G06T 7/0004* (2013.01); *G06T 7/73* (2017.01); *G06T 2207/30148* (2013.01); *G06T 2207/30204* (2013.01)

(58) Field of Classification Search
CPC ... H01L 21/67288; G06T 7/73; G06T 7/0004; G06T 2207/30148; G06T 2207/30204
See application file for complete search history.

(56) References Cited

U.S. PATENT DOCUMENTS

| | | | |
|---|---|---|---|
| 5,129,009 A | | 7/1992 | Lebeau et al. |
| 6,791,680 B1* | | 9/2004 | Rosengaus ....... G01N 21/95623 |
| | | | 356/237.5 |
| 8,796,621 B2 | | 8/2014 | Hatakeyama et al. |
| 9,818,887 B2 | | 11/2017 | Chern et al. |
| 9,891,177 B2 | | 2/2018 | Vazhaeparambil et al. |
| 2003/0179369 A1 | | 9/2003 | Feldman et al. |
| 2006/0124874 A1* | | 6/2006 | Uto ........................ G06T 7/0004 |
| | | | 356/237.2 |
| 2008/0074749 A1* | | 3/2008 | Lizotte ................. G02B 3/0056 |
| | | | 359/626 |
| 2020/0371046 A1* | | 11/2020 | Wang ................. G01N 21/9505 |
| 2024/0161254 A1* | | 5/2024 | Shibayama .......... G06V 10/758 |

OTHER PUBLICATIONS

PCT International Search Report and Written Opinion for PCT/US2024/041888 dated Nov. 25, 2024.

* cited by examiner

*Primary Examiner* — Jamil Ahmed
(74) *Attorney, Agent, or Firm* — Moser Taboada

(57) ABSTRACT

A scanning inspection apparatus detects anomalies on surfaces of objects such as substrates, substrates with bonded chiplets, and carriers with singulated chiplets and the like. In some embodiments, the inspection apparatus includes a time delay integrated (TDI) linear sensor with an optical input and a data output where more than one optical assembly is positioned adjacent to each other with an optical output focused on a different segment of the TDI linear sensor and with an optical input positioned to receive a portion of a surface under examination. The apparatus may further include a platform with an upper surface for supporting an object with the surface under examination and with a motion assembly to move the platform and with a controller in communication with the motion assembly to move the platform in relation to the optical input of the optical assembly.

20 Claims, 9 Drawing Sheets

LARGE FORMAT CONTINUOUS IMAGING SYSTEM

FIELD

Embodiments of the present principles generally relate to semiconductor processing of semiconductor substrates.

BACKGROUND

Traditional wafer inspection tools are used to detect unpopulated surfaces of wafers. The fairly uniform surface of the wafer allows for conventional methods of detection of particles and defects. However, the inventors have observed that for populated wafers, wafers that have had chiplets bonded to the surface, traditional wafer inspection tools are not able to properly inspect the wafer surface due to the substantially different heights between the wafer surface and the chiplet surfaces. The inventors have also observed that after singulation and other processes, the chiplets may be skewed and misaligned relative to each other, dramatically increasing the difficulty in chiplet inspection as the chiplets are no longer positioned where expected. In addition, the inventors have observed that traditional step and repeat acquisition type inspection processes substantially impact the throughput of the inspection process.

Accordingly, the inventors have provided inspection methods and apparatus that quickly and accurately obtain inspection data regardless of height variations or misalignment.

SUMMARY

Methods and apparatus for fast, continuous inspection scanning are provided herein.

In some embodiments, an inspection apparatus for detecting anomalies may comprise at least one time delay integrated (TDI) linear sensor that has a TDI linear sensor length, a TDI linear sensor optical input, and a TDI linear sensor data output, and a plurality of optical assemblies positioned adjacent to each other where each of the plurality of optical assemblies is positioned with an optical output focused on a segment of the TDI linear sensor length and an optical input with an input field-of-view (FOV) positioned to receive a portion of a surface under examination.

In some embodiments, the inspection apparatus may further include a TDI linear sensor with a length of approximately 80 mm, a platform with an upper surface for supporting an object with the surface under examination and with a motion assembly configured to move the platform and a controller in communication with the motion assembly to move the platform in relation to the optical input of the plurality of optical assemblies, a controller that moves the platform to adjust a distance between the optical input and the surface under examination, a controller that is in communication with the motion assembly, the plurality of optical assemblies, and the TDI linear sensor and is configured to scan an entire surface of a substrate. a substrate that has chiplets bonded to the substrate, a controller that is in communication with the motion assembly, the optical assemblies, and the TDI linear sensor and is configured to scan a carrier with singulated chiplets, an integrated Z-profiler with a laser-based auto-focus module configured to determine a Z-profile of the surface under examination prior to acquisition of a surface image by the TDI linear sensor or an external Z-profiler configured to provide a Z-profile of the surface under examination prior to acquisition of a surface image by the TDI linear sensor where the external Z-profiler is in communication with the controller, a plurality of optical assemblies that have a similar focus and FOV, at least one of the plurality of optical assemblies incorporates epi-illumination or darkfield illumination, and/or at least one of the plurality of optical assemblies has a tunable lens configured to focus the at least one of the plurality of optical assemblies.

In some embodiments, an inspection apparatus for detecting anomalies may comprise at least one time delay integrated (TDI) linear sensor that has a TDI linear sensor length of approximately 50 mm to approximately 160 mm, a TDI linear sensor optical input, and a TDI linear sensor data output, a plurality of optical assemblies positioned adjacent to each other where each of the plurality of optical assemblies is positioned with an optical output focused on a segment of the TDI linear sensor length and an optical input with an input field-of-view (FOV) positioned to receive a portion of a surface under examination, a platform with an upper surface for supporting an object with the surface under examination and with a 4-axis motion assembly configured to move the platform, and a controller in communication with the 4-axis motion assembly, the plurality of optical assemblies, and the TDI linear sensor and is configured to scan an entire surface of a substrate or a carrier.

In some embodiments, the inspection apparatus further includes a substrate that has chiplets bonded to the substrate, a plurality of optical assemblies that have a similar focus and FOV, at least one of the plurality of optical assemblies incorporates epi-illumination or darkfield illumination, at least one of the plurality of optical assemblies has a tunable lens configured to focus the at least one of the plurality of optical assemblies, and/or an integrated Z-profiler with a laser-based auto-focus module configured to determine a Z-profile of the surface under examination prior to acquisition of a surface image by the TDI linear sensor or an external Z-profiler configured to provide a Z-profile of the surface under examination prior to acquisition of a surface image by the TDI linear sensor where the external Z-profiler is in communication with the controller.

In some embodiments, a method of obtaining inspection data may comprise scanning across a surface of a substrate or carrier with a plurality of optical assemblies positioned adjacent to each other, receiving image data from the surface into the plurality of optical assemblies which is focused onto a single time delay integration (TDI) linear sensor where each optical assembly focuses image data on a different portion of the TDI linear sensor, reconstructing the image data from the TDI linear sensor to form reconstructed image data and mapping the reconstructed image data to a location on the surface, analyzing the reconstructed image data and location data to determine locations of anomalies and form a defectivity map of the surface, and forming inferences based on the defectivity map and performing a corrective action based on the inferences.

In some embodiments, the method may further include a corrective action that includes marking chiplets as defective and removing the chiplets from a bonder selection pool, and/or a corrective action includes augmenting a pre-bonding process to mitigate future anomalies.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
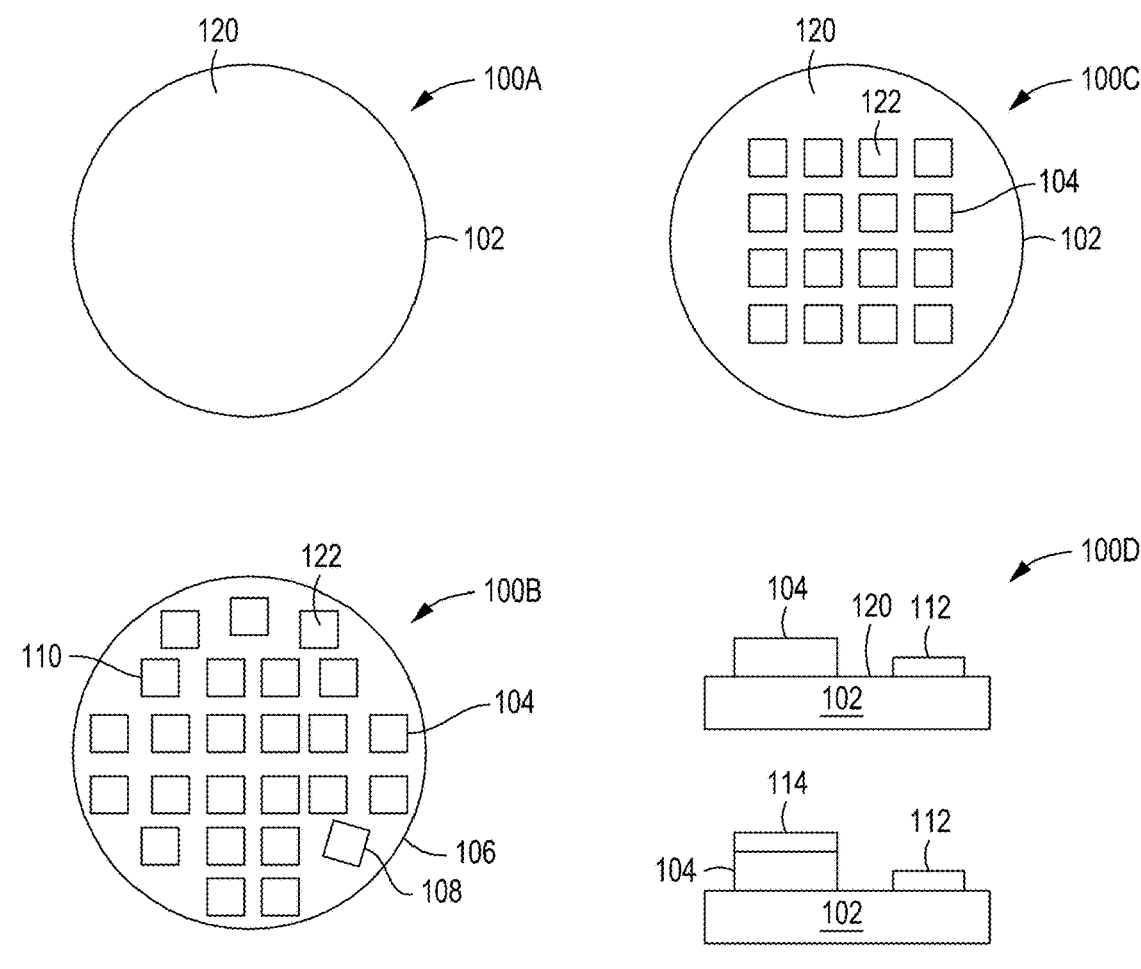
FIG. 1 depicts top-down views and a cross-sectional view of multiple types of substrates in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide improved inspection scanning of wafers and/or chiplets, allowing fast, continuous scanning of, for example, bonded or unbonded wafers and singulated chiplets to minimize throughput impacts from inspection processes. The technology disclosed herein is especially beneficial as a high-speed, large-format continuous imaging inspection system that can detect defects and particles in the context of chip-to-wafer hybrid bonding and other inspection scenarios. The inspection system advantageously provides full wafer coverage and addresses a range of challenges unique to, for example, hybrid bonding processes and misaligned chiplets. Chip-to-wafer hybrid bonding requires defect inspection of three unique sample types (flat substrate wafers, singulated chiplets, and bonded chiplets on substrate wafers). Height variations and misalignment of chiplets pose challenges to rapid measurements that do not exist with standard flat substrate wafers. To overcome the challenges, the inspection system of the present principles has unique capabilities that traditional optical inspection tools do not. The inspection system of the present principles is also applicable for use with, for example, large display panel inspection applications and the like.

Hybrid bonding is a packaging and chip-stacking technique in which singulated chiplets are precisely fused onto a larger substrate wafer or bonding wafer. The metallic interconnects embedded in the dielectric of both the chiplet and the substrate are bonded as well as the dielectric material—creating a 'hybrid bond.' When brought into contact, the dielectric layers of the chiplet and substrate weakly bond with one another almost instantly. A subsequent high-temperature annealing step is then performed to fuse the metallic interconnect, as well as strengthen the dielectric layer bond strength. The presence of items such as particles, chips, cracks, or excessive topographical variations on the chiplet/substrate surfaces adversely affect the bond quality and give rise to post-bonding defects. The post-bonding defects generally manifest as air gaps or voids of various sizes that impede proper interconnect formation, adversely impact yield, and result in costly wastage of fully manufactured chiplet/substrate dies. The wastage is particularly severe in use cases where a single substrate die may host multiple chiplets (either stacked side-by-side on the substrate, or one-atop-another).

If the inspection system is to be useful, for example, for such bonding applications, the inspection system has to have the capability to scan full non-bonded wafers (i.e., bonding substrates on which chiplets can be bonded to), singulated (likely misaligned) and unbonded chiplets on a carrier, and bonded chiplets on a bonding substrate. In a view 100A of FIG. 1, a bonding substrate 102 is depicted. The bonding substrate 102 may include surface or sub-surface redistribution layers (RDLs) or other circuitry that can interface with chiplets that are bonded to the bonding substrate 102. The upper surface 120 of the bonding substrate 102 is generally a uniform flat surface. In a view 100B of FIG. 1, a carrier 106, such as but not limited to a tape frame and the like, is depicted and holds chiplets or dies 104. The dies 104 have been singulated (separated) and are adhered to the carrier 106 to allow a bonder to pick up the dies 104 and place the dies 104 on the bonding substrate 102 during a bonding process. Although the carrier 106 sufficiently holds the dies 104 for processing, the dies 104 are not always positioned in an aligned manner due to the singulation process which destroys the lithographically defined alignment and due to the flexibility of the carrier 106.

Thus, some of the dies 104 may be skewed 108 or out of row or column alignment 110. As the carrier 106 flexes, top surfaces 122 of the dies 104 will also vary in height relative to each other. In a view 100C of FIG. 1, the bonding substrate 102 is depicted with the dies 104 bonded to the upper surface 120 of the bonding substrate 102. The top surfaces 122 of the dies 104 and the upper surface 120 of the bonding substrate 102 present a substantial height difference that must be overcome when scanning a bonded wafer. In a cross-sectional view 100D of FIG. 1, the top example is the bonding substrate 102 with dies 104 bonded to the upper surface 120 and smaller dies 112 bonded to the upper surface 120. In the bottom example, an additional die 114 has been bonded to the dies 104 which further increases the height difference between the upper surface 120 and also surfaces of the smaller dies 112. As used herein, the term 'chiplet' or 'die' may be used interchangeably and refer to semiconductor circuitry that may be singulated and then bonded to a wafer or substrate. In some instances, a die could contain more than one chiplet or only one chiplet.

The inventors have observed that a standard approach would be to utilize a step-and-repeat acquisition scheme in which the optical system is moved to a target location, auto-focused, image acquired, and then moved to a new location. However, a step-and-repeat approach is too slow when the number of target locations approaches thousands of sites such as in advanced semiconductors. The inventors found, however, that a time-delay-integration (TDI) linear sensor could be utilized to continuously acquire a rectangular strip of image data without stopping at each individual image location. However, the inventors further found that addressing singulated dies and bonded wafers with TDI linear sensors presented a significant challenge due to the lack of optics with microscopic resolutions and with fields of views (FOVs) compatible with the large TDI linear sensors. The inventors discovered that a multi-head, multi-illumination optical inspection system combined with a large-format TDI linear sensor could be used to overcome the challenges (multiple optical heads provided the necessary microscopic resolutions with a combined FOV compatible with the large format TDI linear sensor in order to achieve fast scanning speeds) and achieve an ideal combination of throughput, magnification, and sensitivity needed for pre-bonding inspection and for post-bonding inspection. In addition, the use of multiple optical heads also allows for a cost-effective inspection system (a single optical solution with microscopic resolutions and very large FOVs would be prohibitively expensive and fragile) with the flexibility to have individual control over each of the optical heads to scan at different resolutions, focus heights, and fields of view, etc.

Figure 2:
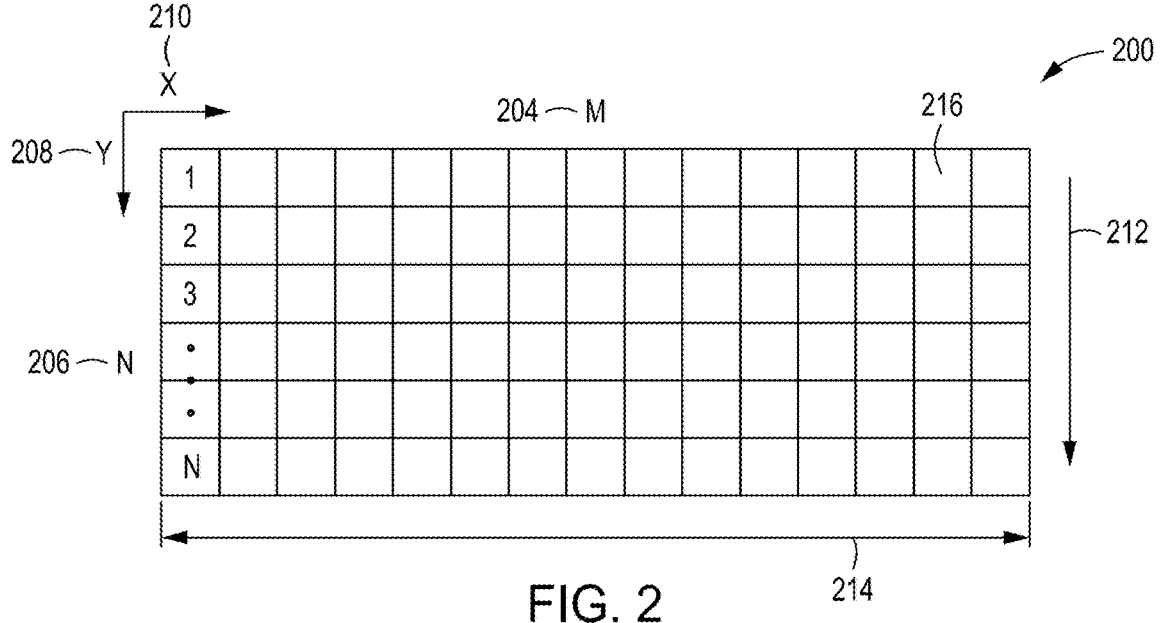
FIG. 2 depicts an operational continuous image detection array for a time delay integrated (TDI) linear sensor in accordance with some embodiments of the present principles.

In the present techniques, large-format TDI linear sensors are used to enable the use of multiple optical assemblies with a single sensor. In FIG. 2, a TDI linear sensor operation 200 is depicted. TDI linear sensors have a length M 204, and a width N 206. The number of pixels 216 along the length M 204 (X-axis 210) corresponds to the available lateral field of view along an object (e.g., die surface, wafer surface, etc.). The number of pixels along the width N 206 corresponds to the number of stages (1–N) within the TDI linear sensor. A sample is moved 212 via a stage (1–N) along the Y-dimension 208 and the sample is imaged N times by the sensor, increasing the number of photons collected for a given sample and improving SNR (signal-to-noise) without requiring hesitation over the sample (continuous imaging). In some embodiments, the length M 204 may have a length 214 of approximately 10 mm to approximately 160 mm or more.

Figures 3, 4:
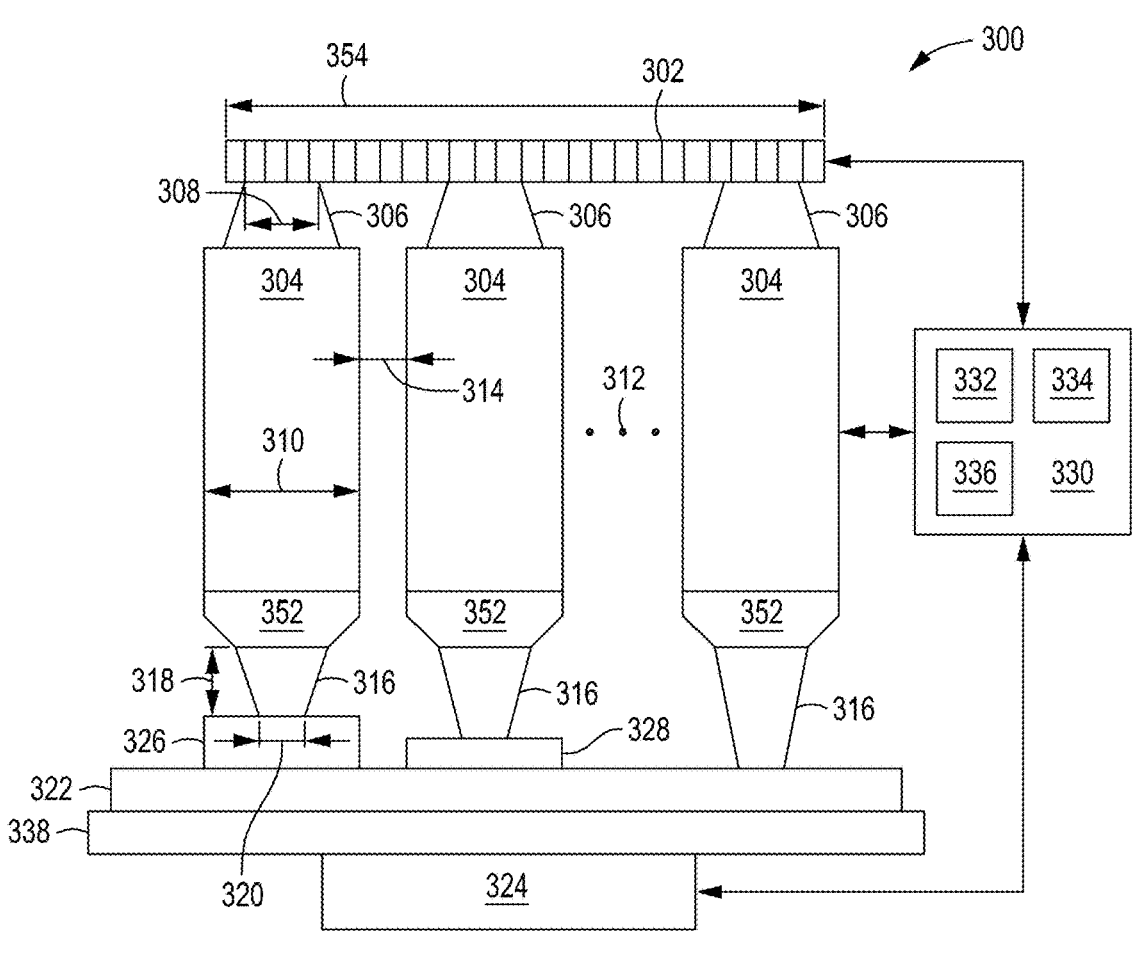
FIG. 3 depicts a cross-sectional view of an inspection system in accordance with some embodiments of the present principles.
FIG. 4 depicts a top-down view of scanning patterns of an inspection system in accordance with some embodiments of the present principles.

In FIG. 3, an inspection system 300 is depicted using a TDI linear sensor 302, a plurality of optical assemblies 304, a stage 338, a motion assembly 324, and a controller 330. The motion assembly 324 moves a sample on the stage 338 in multiple axes to ensure complete inspection scanning of the sample. In some embodiments, the motion assembly is a 4-axis stage (i.e., X, Y, Z, Theta motion). The motion assembly 324 can place an optical head 352 of an optical assembly 304 at any location upon a substrate 322 under test. The stage motion, sensor acquisition, and illumination are coordinated by a combination of software commands/queries in the controller 330 and/or digital triggering signals meant to facilitate tighter timing and synchronization between the inspected item and the scanning system. Each optical head 352 can also optionally contain an independent Z-positioner (e.g., motor-based, piezo, etc.). The TDI linear sensor 302 may have a length 354 of approximately 10 mm to approximately 160 mm. In some embodiments, the TDI linear sensor 302 may be replaced with a non-TDI linear sensor. If a non-TDI linear sensor is used in place of the TDI linear sensor 302, special attention must be paid to ensuring a good signal to noise ratio of the inspection measurement (e.g., use of brighter light sources, more efficient optics, and/or more sensitive image detectors in the sensor and the like, etc.).

A larger TDI linear sensor can continuously image a wider field of view, improving throughput. However, the inventors have found two distinct challenges to the use of larger sensor lengths. First, a lack of available optics capable of balancing the magnification, numerical aperture (i.e., resolution) and FOV that are required for an inspection system for bonding applications. Existing lenses dedicated to large-format TDI sensors may have the required magnifications (e.g., –5×) but suffer from extremely low resolution (e.g., NA=0.01). Alternatively, microscope objectives have both the magnification (e.g., 5-10×) and resolutions (e.g., NA=0.15-0.30), but cannot generally support sensor sizes larger than 30 mm. Second, when imaging wider FOVs on singulated dies or bonded substrates, multiple chiplets may be in view simultaneously. The chiplets in view may each have different focal planes, and a single lens cannot bring all of the chiplets in view into focus simultaneously. Reacquiring the data for multiple focal planes by rescanning results in a significant throughput decrease. The inventors discovered that by using a large-format TDI linear sensor with multiple, tightly-packed, optical assemblies 304 consisting of high-magnification, high-resolution microscope bodies, high throughput is achievable. The microscope bodies of the optical assemblies 304 are oriented along the long dimension of the TDI linear sensor. Each optical assembly 304 contains an illumination system (e.g., internal or external to the optical assembly 304) discussed in detail below. In some embodiments, the optical assembly 304 also contains a Z-positioner (e.g., based on a motor, piezo, liquid lens, or motorized lens unit, etc.) to compensate for the different height ranges of features on the sample being inspected.

As depicted in FIG. 3, the optical assembly 304 of the inspection system 300 has a sample FOV 316 that is adjusted to have a FOV width 320 on a sample of approximately 1 mm to approximately 5 mm in some embodiments. A Z-distance 318 between the optical head 352 and a sample surface can be adjusted by the motion assembly 324 and the controller 330 as needed (e.g., to maintain Z-distance 318 within focusing range of optical assembly 304, to clear maximum Z-height on wafer, etc.). The optical assembly 304 may have a width 310 of approximately 30 mm to 80 mm in some embodiments. The width 310 is typically dictated by the internal space required to house the internal optical components and optional internal lighting sources and the like. Any number of optical assemblies may be used from 2–N 312. A spacing distance 314 between the optical assemblies may be from approximately 1 mm to approximately 20 mm in some embodiments. Closer spaced optical assemblies allow more assemblies per TDI linear sensor but spacing should be sufficient such that vibration or other operational issues are avoided (optical assemblies should not come into contact with each other during operation).

The optical assembly 304 transmits an image of a portion of the sample surface through the optical assembly 304 and onto a portion of the M pixels (see FIG. 2) of the TDI linear sensor 302 via a focused TDI FOV 306. In some embodiments, the width 308 of the portion of the TDI linear sensor 302 may be from approximately 5 mm to approximately 30 mm depending on the magnification capabilities of the optical assembly 304. The sample surfaces may be at different Z-heights (e.g., chiplet 326, shorter chiplet 328, no chiplet, etc.) and require different focus planes or adjustments to a Z-axis of the stage 338. In some embodiments, each optical head 352 maps to a different location along the TDI linear sensor length (i.e., across the M pixels shown in FIG. 2) and a different location upon the sample with each optical assembly independently focused on the sample underneath using each optical assembly's independent illumination/focusing system.

Figure 5:
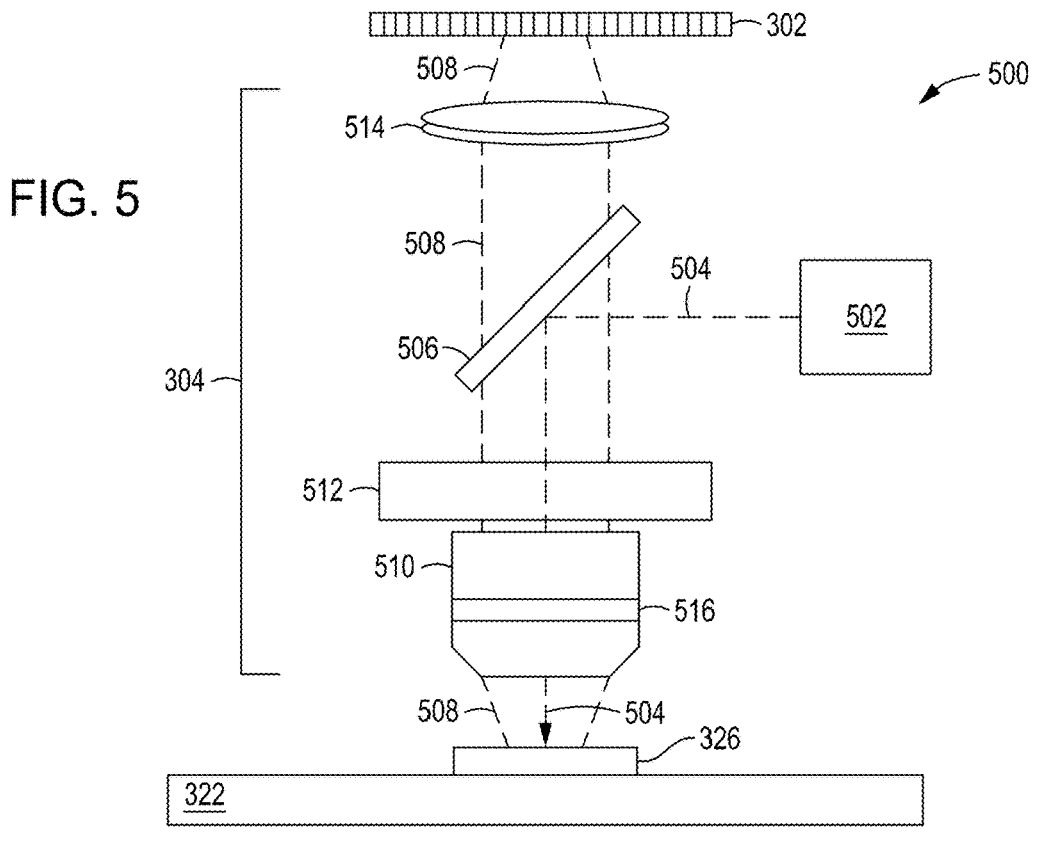
FIG. 5 depicts a cross-sectional view of an inspection system in accordance with some embodiments of the present principles.

An example of an embodiment of the optical assembly 304 is depicted in FIG. 5. An optical head 510 has optics 516 that aid in directing the sample FOV to the sample surface to obtain image data 508. In some embodiments, the optical assembly has an epi-illumination capability. The sample surface is illuminated internally by a light source 502 that produces an illumination beam 504 that is reflected by lens 506 to impinge on the surface of the sample. A Z-position assembly 512 is used to make high-speed changes to allow for focus of the sample FOV on the sample surface as the sample moves under the inspection system 500. In some embodiments, the Z-position assembly may use a motor to move the assembly, may use an electrically tunable lens or piezo and the like. The image data 508 traverses through the optical assembly to a focusing lens 514 and then onto a portion of the M pixels on the TDI linear sensor 302.

Referring back to FIG. 3, the controller 330 can provide full control of the motion of the stage 338 via the motion assembly 324. The controller 330 can also communicate with the optical assembly 304 to facilitate in adjusting illumination, focus, and other optical assembly parameters and the like. The controller 330 may also receive raw image data from the TDI linear sensor 302 and/or provide control of the TDI linear image sensor 302 as needed. The controller 330 may directly control the inspection system 300, or alternatively, control the computers (or controllers) associated with the inspection system 300. In operation, the controller 330 enables data collection and feedback from the inspection system 300 to optimize performance of the inspection system 300 and to control the processing flow according to the methods described herein. The controller 330 generally includes a central processing unit (CPU) 332, a memory 334, and a support circuit 336. The CPU 332 may be any form of a general-purpose computer processor that can be used in an industrial setting. The support circuit 336 is conventionally coupled to the CPU 332 and may comprise a cache, clock circuits, input/output subsystems, power supplies, and the like. Software routines, such as methods as described herein may be stored in the memory 334 and, when executed by the CPU 332, transform the CPU 332 into a specific purpose computer (controller 330). The software routines may also be stored and/or executed by a second controller (not shown) that is located remotely from the inspection system 300.

The memory 334 is in the form of computer-readable storage media that contains instructions, when executed by the CPU 332, to facilitate the operation of the semiconductor processes and equipment. The instructions in the memory 334 are in the form of a program product such as a program that implements methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

The inspection system 300 yields a high-speed, large format continuously imaging inspection system capable of handling the various sample types depicted in FIG. 1. In some embodiments, the inspection system 300 consists of multiple independently configured optical assemblies, each mapping onto a different section of a single TDI linear sensor. Each optical assembly 304 can also be independently focused onto a respective part of the sample (e.g., wafer surface, chiplet surface, etc.). Because the optical assemblies are independently configurable, the inspection system 300 is very flexible. For example, if high throughput is desired, each optical assembly 304 can be identical and configured to image a different part of the sample (e.g., different chiplets, different surfaces, etc.). With identically configured optical assemblies, a larger area of the sample can be measured simultaneously, decreasing the overall amount of time to perform any individual measurement. If multiple depth inspection information is desired, each optical assembly 304 can be configured to map a different type of sample at a different depth (e.g., optical assembly 1 maps chiplet type 1 at height 1 and optical assembly 2 maps a substrate at height 2, and so forth, etc.).

Figure 13:
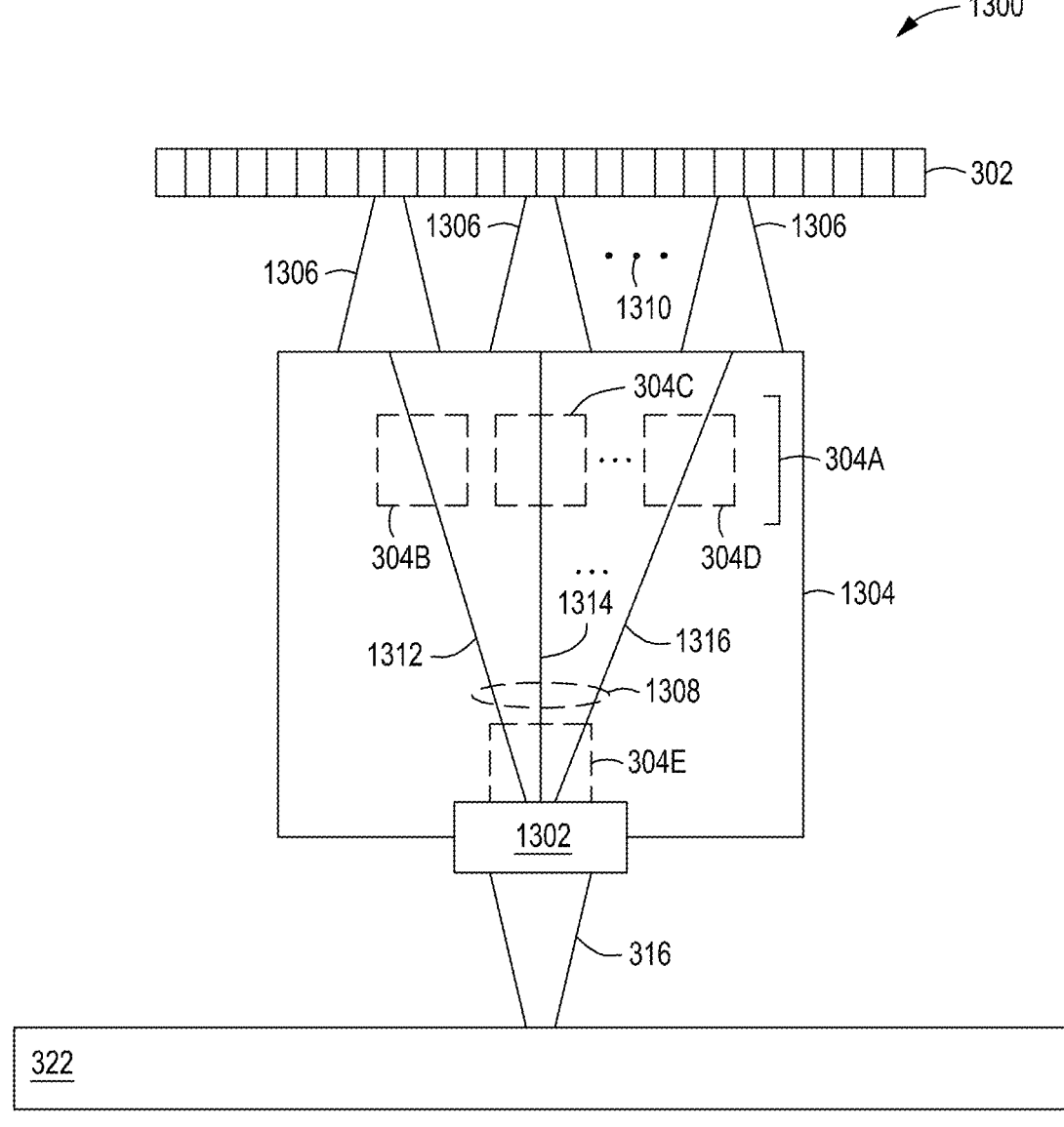
FIG. 13 depicts a cross-sectional view of an inspection system with a single optic input and split output in accordance with some embodiments of the present principles.

In some embodiments, an inspection system 1304 may have one or more optical assemblies 304 with a single optic 1302 focused on the substrate 322 as depicted in a view 1300 of FIG. 13. The sample FOV 316 provides an image of the substrate 322 on the single optic 1302. The image of the substrate 322 from the single optic 1302 is then split 1308 into a plurality of output FOVs 1306 on different areas of the TDI linear sensor 302 produced by the one or more optical assemblies 304. The splitting of the image from a single optic 1302 allows for a single input FOV with a variable number 1310 of output FOVs 1306 focused at different positions on the TDI linear sensor 302. In some embodiments, the output FOVs 1306 may be split as a function of wavelength and/or polarization and/or based on a portion of the image from the input FOV (e.g., 50% going into path 1 1312, 25% into path 2 1314, 25% into path N 1316, etc.). In some embodiments, the one or more optical assemblies 304 of the inspection system 1304 includes a plurality of optical assemblies 1–N 304A (including optical assembly 1 304B, optical assembly 2 304C, optical assembly N 304D, etc.) with each optical assembly 1–N 304A receiving one path (path 1 1312, path 2 1314, path N 1316, etc.) of the split FOV from the single optic 1302 and each optical assembly 1–N 304A providing one of the plurality of output FOVs 1306 that impinges at different positions on the TDI linear sensor 302. In some embodiments, the one or more optical assemblies 304 of the inspection system 1304 is a single optical assembly 304E which receives the image from the single optic 1302 and splits the output of the single optical assembly 304E into the plurality of output FOVs 1306.

Referring back to FIG. 3, if multiple magnification is desired, each optical assembly 304 may be configured with a different magnification geared towards separate applications (e.g., optical assembly 1 has a 50× magnification to look for tiny defects and optical assembly 2 has a 1× magnification to look for large cracks and gross misalignment, and so forth, etc.). As discussed in more detail below, if multiple types of illumination are desired, each optical assembly 304 may be configured with different types of illuminations to cater to different types of applications. For example, optical assembly 1 can be a standard epi-illumination to look for cracks, optical assembly 2 can be darkfield illumination for increased sensitivity to particles, and/or optical assembly 3 can be configured to have a Nomarski DIC arm or asymmetric illumination for heightened sensitivity to topographical variations across the sample and the like. Any wavelength can be used by an optical assembly as long as the spectral range is detectable by the TDI linear sensor 302. The inspection system 300 can also be configured with any combination of variants as well (e.g., high throughput, multiple depths, multiple magnifications, multiple illumination types, etc.).

In one example use case, for larger TDI linear sensors with a length of approximately 160 mm, at least three optical assemblies could be placed adjacent to one another, improving throughput by a corresponding factor. As a simplified example, but not meant to be limiting, the FOV at a sample of each optical assembly can be equal to a microscope objective's field number (FN) divided by microscope objective's magnification. Thus, a standard 5× microscope objective (FN=25) supports a FOV at the object of 25/5×=5 mm. Three optical assemblies would then have access to approximately 15 mm at the sample and 75 mm at the sensor. In a view 400 of FIG. 4, an acquisition pattern of the multi-head inspection system is depicted based on the example use case. Each optical assembly 304 sweeps a first swath 408 with a distinct rectangular shape across the substrate 322, as the substrate moves in the Y direction 402. Because the inspection system has three optical assemblies 304, three swaths of the substrate 322 are made with each pass of the substrate 322, increasing throughput. After the first swath 408 has been acquired, the substrate 322 is moved in the X-direction 406 the width of a swath and a second swath 410 is acquired directly adjacent to the first swath 408. After the completion of the second swath 410, the substrate 322 is moved in the X-direction 406 the width of a swath and a third swath 412 is acquired directly adjacent to the second swath 410. The process is repeated until the entire sample has been acquired. Because only a single TDI linear sensor is used in conjunction with multiple optical assemblies, the inspection system is more cost effective than systems using multiple TDI linear sensors adjacent to each other and each with an optical system for each of the multiple TDI linear sensors. Multiple TDI linear sensors also require additional synchronization between the sensors that is not required with the methods and apparatus of the present principles that use only a single TDI linear sensor.

In some embodiments, independent focusing of each individual optical assembly of the inspection system is needed. In such cases, each optical assembly is focusable at an appropriate Z-plane to allow acquisition of the in-focus image. Passive autofocus methods based on image analysis are too slow for a TDI-based inspection system in which the sample is continuously moving. The inventors have found that using an independent Z-profiler or an array of Z-profilers to provide a Z-height map of the sample allows fast adjustment of the Z-positioner of each optical assembly during the sample image acquisition. The inventors have also found that with the presence of separate and independent Z-positioners on each optical assembly, two modes of operation are achievable—high-throughput mode and multiple-depth mode. In the former implementation, multiple chiplets of varying thicknesses can be measured simultaneously by the inspection system, improving acquisition speed. Alternatively, each optical assembly can focus on a completely different sample target at different depths within the sample (e.g., a first optical assembly focuses on a bonded chiplet at depth $Z_1$, whereas a second optical assembly focuses on the substrate at depth $Z_2$).

Z-height information for focusing of each optical assembly can come from internal or external sources (e.g., integrated apparatus in the inspection system or separate apparatus that gives Z-profile input to the inspection system, etc.). The Z-height of the sample should be measured and relayed to the optical assembly prior to acquiring an image of that location on the sample. In a view 600A of FIG. 6, an example of an integrated focus assembly based on a laser autofocus assembly 602 is depicted. The laser autofocus assembly 602 produces a laser beam 604A that traverses through the optical assembly and impinges on a sample (e.g., chiplet 326, etc.). the laser beam 604A is reflected off the sample surface and a reflected laser beam 604B travels back to the laser autofocus assembly 602. The laser autofocus assembly 602 uses the timing of the laser beam 604A and the reflected laser beam 604B to construct a Z-profile (Z-height) of the sample surface that will be subsequently sampled.

Figure 6:
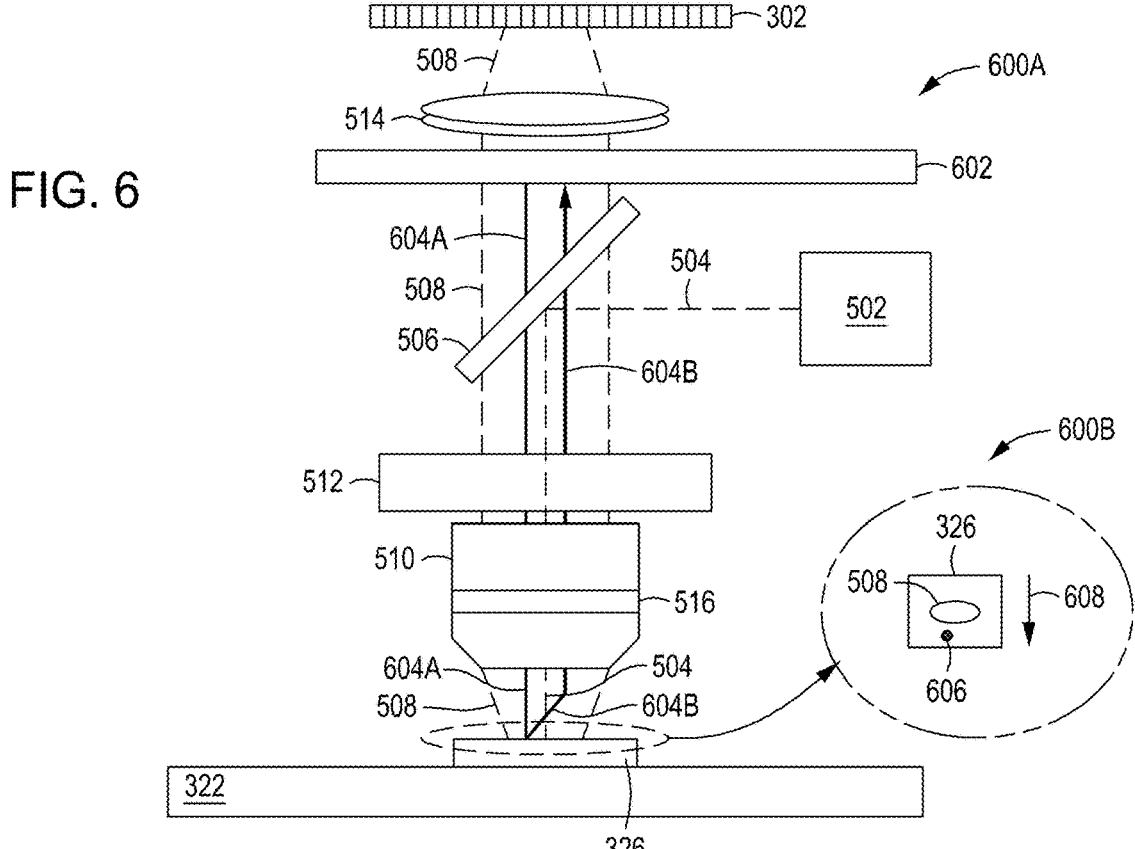
FIG. 6 depicts a cross-sectional view of an inspection system with an internal laser-based Z-profiler in accordance with some embodiments of the present principles.
Figure 7:
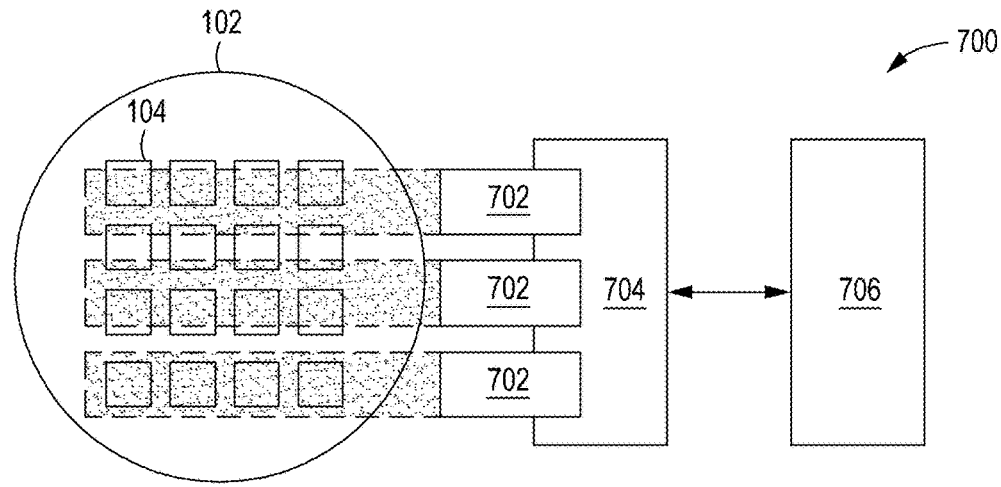
FIG. 7 depicts a top-down view of an external Z-profiler in accordance with some embodiments of the present principles.

As depicted in the enlarged top-down view 600B of FIG. 6 enclosed in dashed circle, the laser autofocus assembly 602 focuses the laser beam 604A on a spot 606 of the sample ahead of the image data 508 to be acquired by the inspection system when the sample moves in the Y-direction 608. The sample passes under the TDI linear sensor footprint after the laser autofocus assembly 602 has acquired Z-height information and delay information (timing data to indicate location of measurement as scanning is performed) so that the location of the height measurement can be synchronized with the TDI linear sensor footprint and image acquisition location. In a view 700 of FIG. 7, an external Z-profiler assembly 704 is depicted. In some embodiments, the external Z-profiler assembly 704 may be a laser-based Z profiler and the like. The external Z-profiler assembly 704 may be placed in proximity of the inspection system 706 such as within an inspection chamber or external to the inspection chamber and the like. The external Z-profiler assembly 704 may use one or more lasers 702 to scan the substrate 102 for the height of dies 104 and the like. The Z-profile (height profile) of an entire substrate or carrier and the like can then be transferred to the inspection system 706 prior to image scanning by the inspection system 706. The inspection system 706 can then use the Z-profile of the substrate to adjust focus of each of the optical assemblies prior to image acquisition by the optical assemblies.

Illumination of samples is primarily accomplished using light sources in the ultraviolet (UV)/visible/near infrared (NIR) wavelength range. The wavelength is largely governed by the TDI linear sensor capabilities. Other wavelengths may be used if compatible with the TDI linear sensor used in the inspection system. Silicon-based TDI linear sensors have better sensitivity from approximately 300 nm wavelengths to approximately 1100 nm wavelengths. In some embodiments, each optical assembly has an illumination source. The illumination source may fall under one of two modes of illumination schemes. Referring back to FIG. 5, the optical assembly 304 uses a first mode of epi-illumination. Epi-illumination occurs when a sample is illuminated through the optical head 510. The angle of illumination is coincident with the optical axis of the optical head 510. Epi-illumination schemes can come in a range of options to enhance contrast at the sample plane. For example, asymmetric pupil illumination or Nomarski differential interference contrast (DIC) illumination can enhance topographical variations at the sample plane. Variants of epi-illumination include asymmetric illumination in which a flat intensity field is not used at the image pupil, polarized light, or differential contrast imaging.

Figure 8:
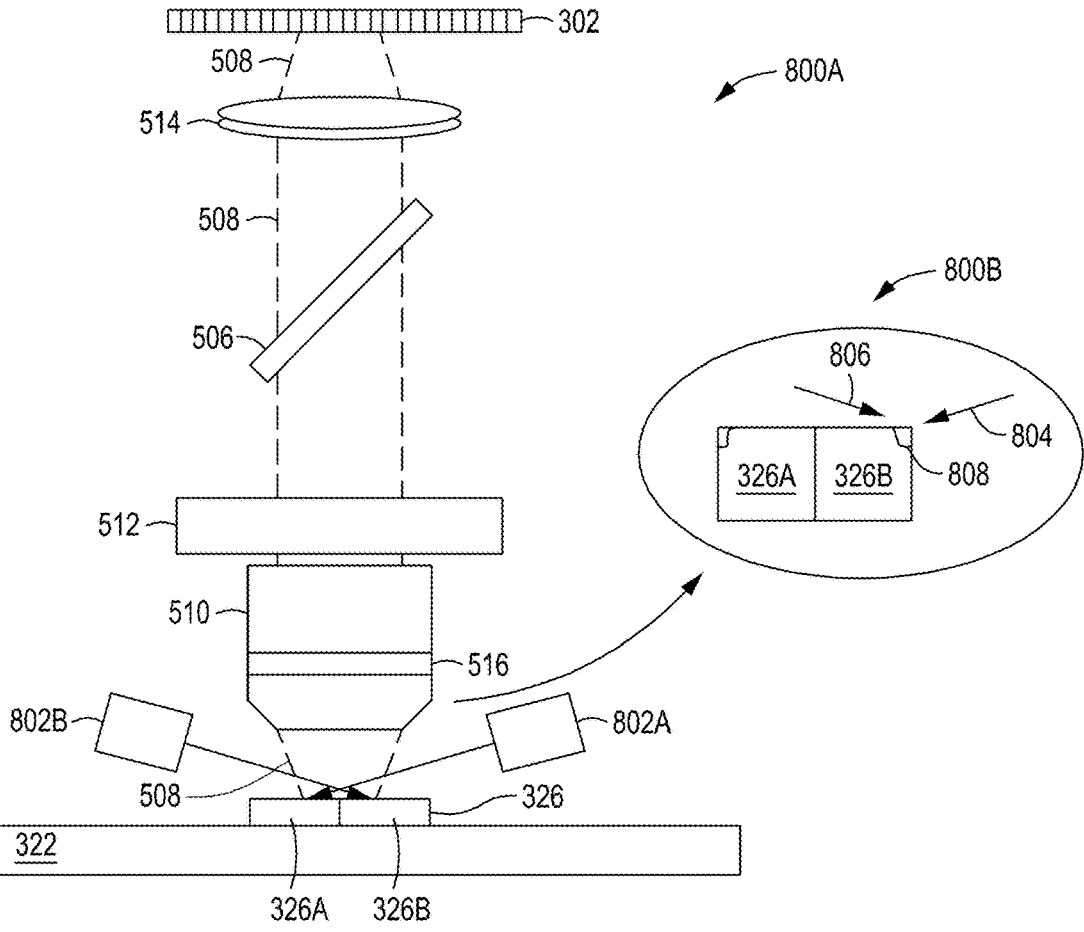
FIG. 8 depicts a cross-sectional view of an inspection system with darkfield illumination in accordance with some embodiments of the present principles.
Figure 12:
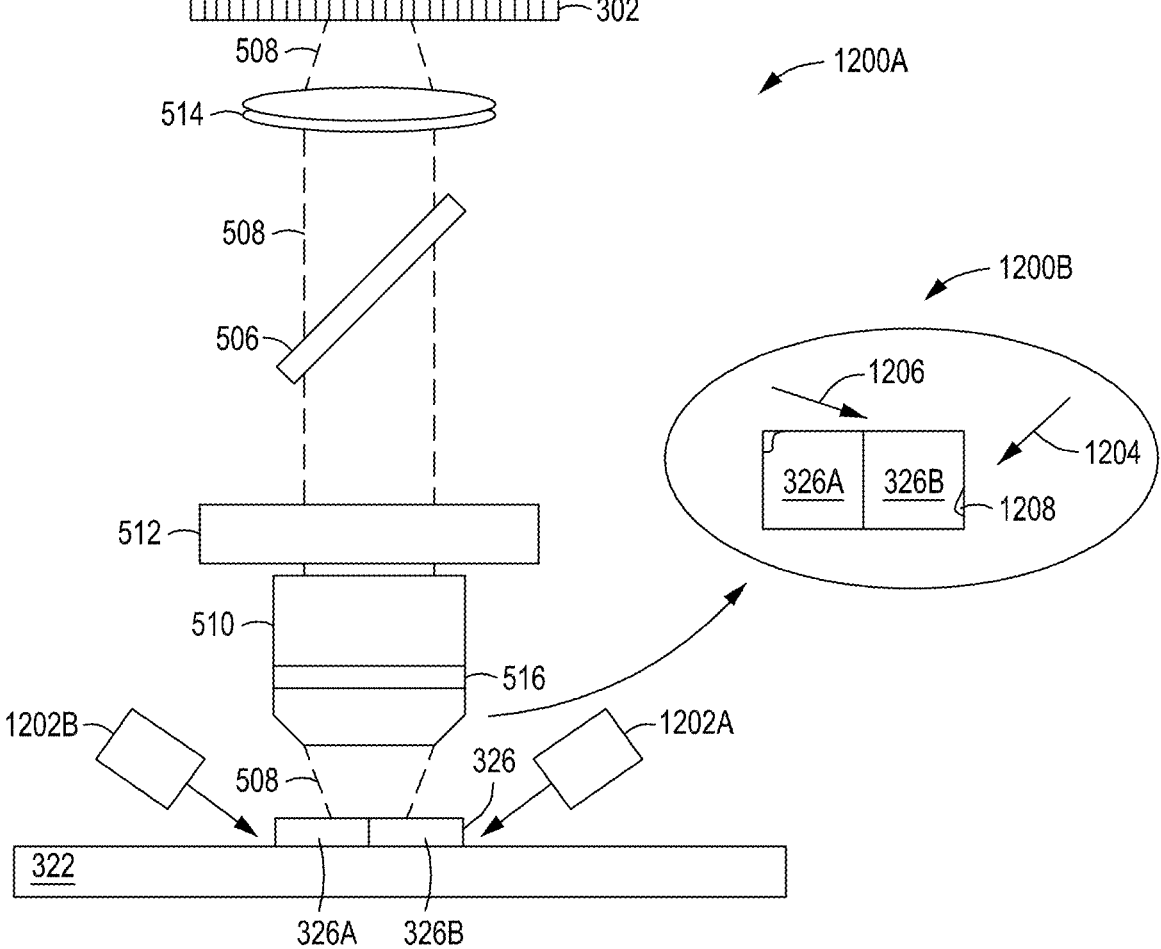
FIG. 12 depicts a cross-sectional view of an inspection system with darkfield illumination in accordance with some embodiments of the present principles.

The second mode of illumination is the oblique-incidence or darkfield illumination. Darkfield illumination occurs when the sample is illuminated at an angle which sits outside of the collection aperture of the optical head 510. Darkfield illumination is particularly sensitive to particles on the chiplet/substrate surface and is also sensitive to large height variations which can cause significant artifacts near the edges of coupons. The inventors have discovered that the darkfield illumination issues can be alleviated for instances with gradual height profile changes when doing top edge inspection by using dual-sided, darkfield illumination as depicted in a view 800A of FIG. 8. In some embodiments, the darkfield illumination is provided by a first external light source 802A and a second external light source 802B. Darkfield illumination is sensitive to rapid height variations caused by the edge of the chiplet 326. The first external light source 802A is used to illuminate a left side 326A of the chiplet 326 and the second external light source 802B is used to illuminate a right side 326B of the chiplet 326. In the expanded view 800B, a corner defect 808 shows with better contrast and detail when light is incident from the left 806 than when light is incident from the right 804 which causes washout and reduced detail. The inventors have also discovered that the darkfield illumination issues can be alleviated for instances with rapid, large height profile changes when doing sidewall or lower edge inspection by using dual-sided, darkfield illumination as depicted in a view 1200A of FIG. 12. In some embodiments, the darkfield illumination is provided by a first external light source 1202A and a second external light source 1202B. The first external light source 1202A is used to illuminate a right side 326B of the chiplet 326 and the second external light source 1202B is used to illuminate a left side 326A of the chiplet 326. In the expanded view 1200B, a lower edge defect 1208 shows with better contrast and detail when light is incident from the right 1204 than when light is incident from the left 1206 which causes a shadow on the right side of the chiplet 326.

In some embodiments, the optical assemblies used in the inspection system may have identical or different illumination types/systems. For example, in some embodiments, an inspection system using a large-format TDI linear sensor may have four optical assemblies. The first optical assembly may have a darkfield illumination system with or without differing wavelengths to better detect particles, a second and third optical assemblies may have epi-illumination with or without differing wavelengths for enhanced crack or chip inspection, and a fourth optical assembly may have a high magnification Nomarski DIC illumination system for topography inspection. A multiple illumination type of inspection system can then handle different use cases of defect inspection without requiring multiple designs of optical assemblies or multiple inspection chambers in a bonding tool, significantly reducing costs and increasing flexibility of the inspection system.

Figure 9:
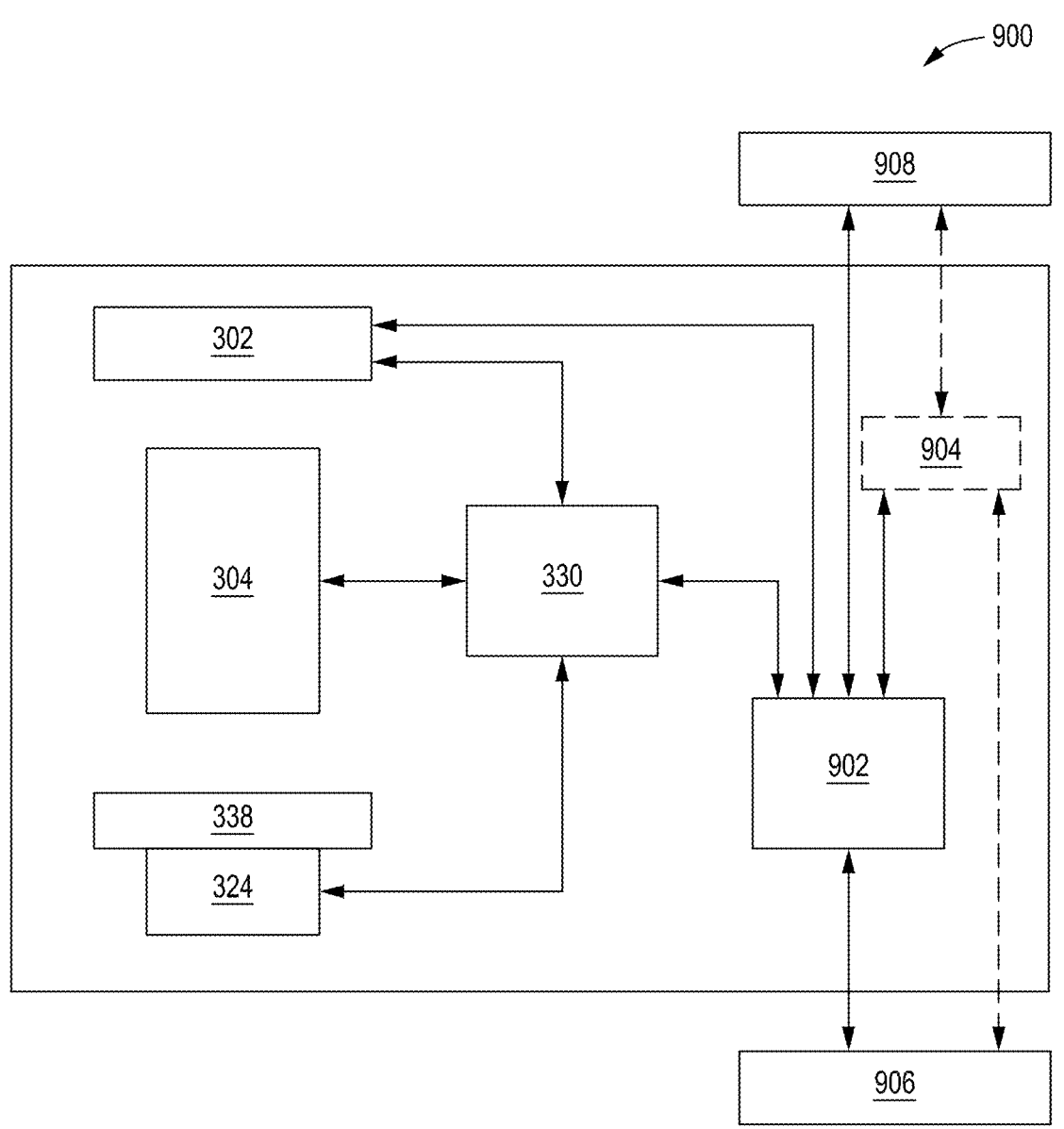
FIG. 9 is a cross-sectional view of an inspection system in accordance with some embodiments of the present principles.

FIG. 9 depicts an inspection system 900 with a controller 330 in communication with a motion assembly 324 with a stage 338, a plurality of optical assemblies 304, a TDI linear sensor 302, and an inspection data processor 902 with an inspection data model 904 (optional). In some embodiments, the inspection data processor 902 may reside, in whole or in part, in the controller 330 and/or the controller 330 may reside, in whole or in part, within the inspection data processor 902. The image data processing generally has three stages—reconstruction, analysis, and inference (machine learning). The reconstruction phase involves taking the raw data (in this case, a stream of pixels out of the TDI linear sensor 302) into the inspection data processor 902, either directly and/or via the controller 330. The inspection data processor 902 maps each pixel to the pixel's correct location in the wafer coordinate space (X, Y, Z). In some embodiments, calibrations may be performed during system setup for each optical assembly, as well as real-time information from the stage 338, motion assembly 324, and the Z-positioners in each optical assembly and the like.

The analysis phase performed by the inspection data processor 902 involves extracting information from the reconstructed image. In some embodiments, areas on the wafer/chiplets that may have a high probability of defectivity may be noted and the like. The analysis can be accomplished by segmenting out areas of interest (e.g., the chiplets) through a range of standard image matching techniques and performing comparisons to reference dies to highlight deviations. For example, a particle on a dielectric surface may appear as a particularly bright pixel under darkfield illumination. Once defective areas are highlighted, the areas can be further classified into their own sub-categories (e.g., particles, cracks, chips, etc.). A defectivity map can then be generated across the sample.

The inference phase performed by the inspection data processor 902 references the multitude of ways in which a defectivity map can impact, for example but not limited to, the operation of a hybrid bonding tool. For example, cracks or scratches found on chiplets or substrates can be used to mark the dies as defective and remove the dies from a bonder selection pool. Individual particles can result in additional pre-processing steps, or alternatively the systematic presence of particles in specific areas of the wafer can be used to tune pre-processing steps for future batches (e.g., performing additional preclean washes prior to bonding, etc.). For example, excessive surface topographical variations can trigger alterations in preceding polishing steps before bonding. In such ways, the defectivity map provides a broad metric of various aspects of tool functioning and can serve to reduce run-to-run variability, provide machine learning for long-term process tuning, and reduce tool maintenance and servicing times. The defectivity data can also be used in binning processes and/or to identify ranges of defective dies and the like.

In some examples, the inspection data model 904 may be used to assist in providing inferences. The inspection data model 904 may be based on historical data and/or based on real-time data obtained from an ongoing inspection process. The inspection data model 904 can be constantly updated with feedback from post-bonding processes 906, either directly or indirectly via the inspection data processor 902. The feedback information may include annealing information, gapfilling information, and/or chemical mechanical polishing (CMP) information and the like related to the post-bonding processes 906 or the bonding processes. The inspection data model 904, directly and/or indirectly via the inspection data processor, can also be used to assist in providing inferences for pre-bonding processes 908 such as precleaning processes, CMP processes, chiplet singulation processes, and the like as discussed above and bonding processes (e.g., hybrid bonding processes, etc.).

Figure 10:
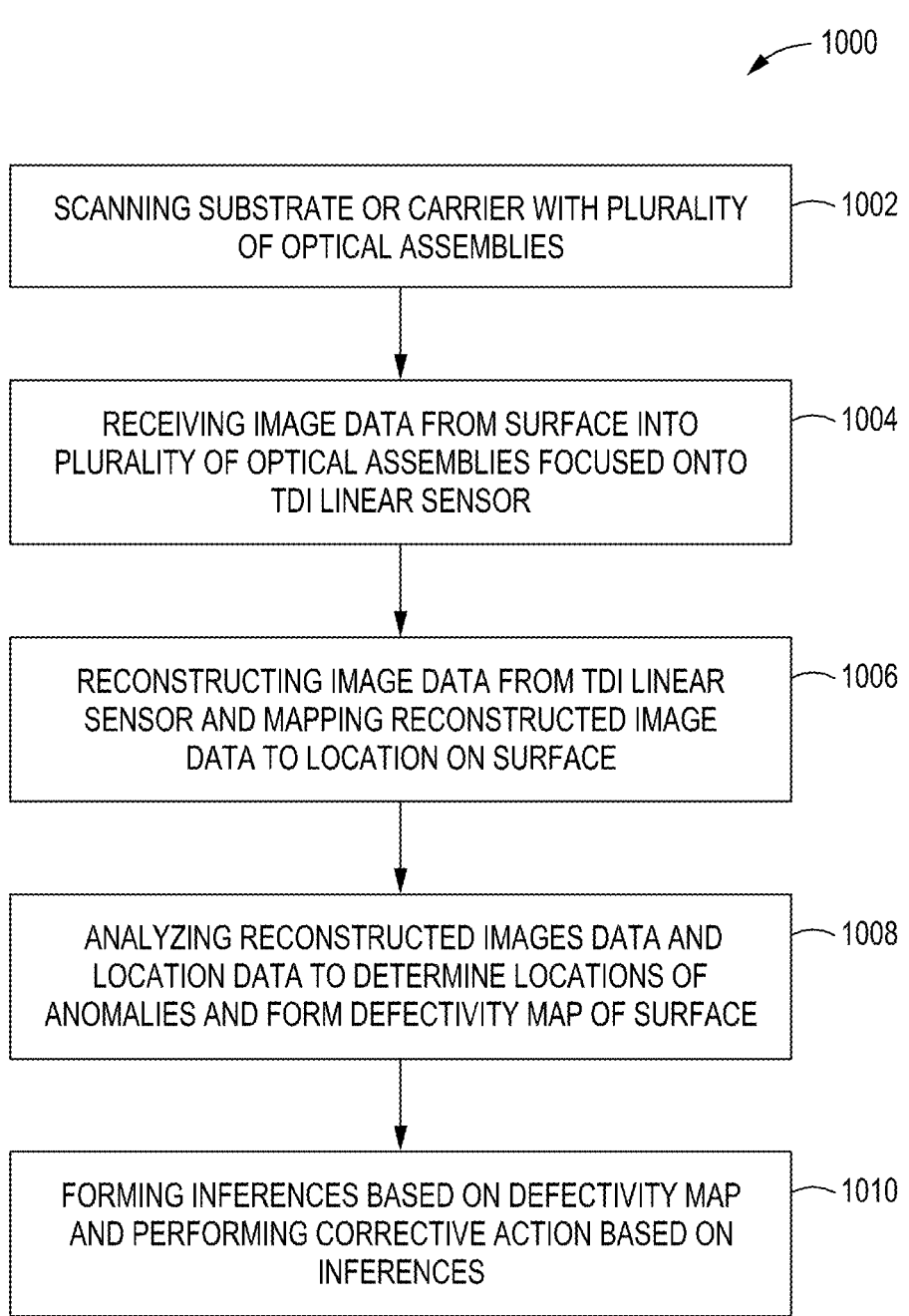
FIG. 10 is a method of obtaining inspection data in accordance with some embodiments of the present principles.

In FIG. 10, in some embodiments but not limited to, a method 1000 of obtaining inspection data may be performed prior to or after bonding processes. In block 1002, a surface of a substrate or carrier is scanned using a plurality of optical assemblies positioned adjacent to each other. The use of multiple optical assemblies may be used to increase throughput. The optical assemblies may have identical or differing configuration parameters such as, but not limited to, magnification, illumination mode, and focal plane and the like as described herein. In some embodiments, the optical assemblies may have internal light sources that operate in an epi-illumination mode. In some embodiments, the optical assemblies may have external light sources that operate in a darkfield illumination mode. Contrast enhancements may also be used. In block 1004, image data is received from the surface into the plurality of optical assemblies which is then focused onto a single TDI linear sensor. Each optical assembly focuses individual image data onto a difference portion of the TDI linear sensor. In some embodiments, three or more optical assemblies may be used. In some embodiments, each of the optical assemblies may have a surface FOV of approximately 1 mm to approximately 5 mm. In some embodiments, the optical assemblies may have a magnification of approximately 5× to approximately 50×. In some embodiments, the TDI linear sensor may have an M length of approximately 10 mm to approximately 160 mm. In some embodiments, each optical assembly may provide an FOV of a surface image onto a portion of the TDI linear sensor of approximately 10 mm to approximately 30 mm.

In block 1006, the image data from the TDI linear sensor is reconstructed and mapped to a location on the surface. In block 1008, the reconstructed image data and location data is used to determine locations of anomalies and to form a defectivity map of the surface. In block 1010, inferences are formed based on the defectivity map and corrective actions are performed based on the inferences. In some embodiments, an inspection model (see, e.g., FIG. 9) may be used to assist in establishing inferences and the like. In some embodiments, the corrective action may include marking chiplets as defective and removing the chiplets from a bonder selection pool. In some embodiments, the corrective action may include augmenting a pre-bonding process, a bonding process, or a post-bonding process to mitigate an anomaly. For example, additional preclean washes may be performed prior to bonding to remove additional particles, reduced bonding pressures for scratched chiplets in the bonding process to reduce chiplet cracking, and/or additional gapfill material may be used after bonding to ensure coverage of varying chiplet heights, and the like.

Figure 11:
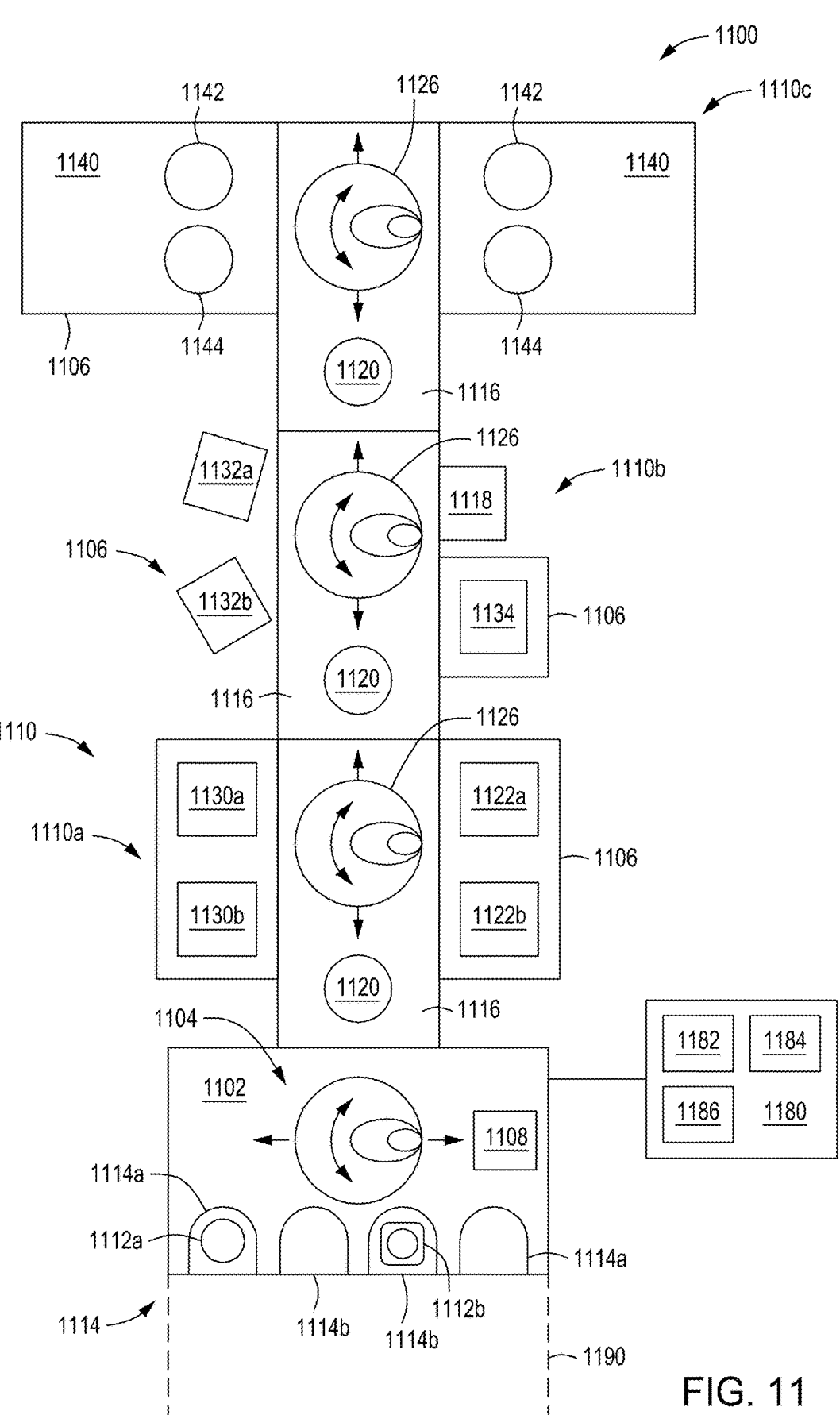
FIG. 11 depicts a schematic of a hybrid bonding system in accordance with some embodiments of the present principles.

Referring back to FIG. 9, the inspection system 900 can be incorporated independent of or within various hardware structures. In some embodiments, the inspection system 900 may be a standalone inspection station and/or may be integrated into a hybrid bonding tool such as the integrated hybrid bonding tool of FIG. 11. For example, in FIG. 11, a schematic top view of an integrated hybrid bonding tool 1100 for bonding dies/chiplets to a target (bonding substrate) is depicted in accordance with at least some embodiments. The methods described above and below may be performed within the integrated hybrid bonding tool 1100 to enhance the hybrid bonding and/or to enhance pre- or post-bonding processes. The integrated hybrid bonding tool 1100 generally includes an equipment front end module (EFEM) 1102 and a plurality of automation modules 1110 that are serially coupled to the EFEM 1102. The plurality of automation modules 1110 are configured to shuttle one or more types of substrates from the EFEM 1102 through the integrated hybrid bonding tool 1100 and perform one or more processing steps to the one or more types of substrates (e.g., source with chiplets, source with singulated chiplets, a target or bonding substrate to bond the chiplets to, bonding substrate with previously bonded chiplets, etc.). Each of the plurality of automation modules 1110 generally include a transfer chamber 1116 and one or more process chambers 1106 coupled to the transfer chamber 1116 to perform the one or more processes. The plurality of automation modules 1110 are coupled to each other via their respective transfer chamber 1116 to provide modular expandability and customization of the integrated hybrid bonding tool 1100. As depicted in FIG. 11, the plurality of automation modules 1110 comprise three automation modules, where a first automation module 1110a is coupled to the EFEM 1102, a second automation module 1110b is coupled to the first automation module 1110a, and a third automation module 1110c is coupled to the second automation module 1110b.

The EFEM 1102 includes a plurality of load ports 1114 for receiving one or more types of substrates. In some embodiments, the one or more types of substrates include 200 mm wafers, 300 mm wafers, 450 mm wafers, tape frame substrates, carrier substrates with or without reconstituted dies/chiplets, silicon substrates, glass substrates, or the like. In some embodiments, the plurality of load ports 1114 include at least one of one or more first load ports 1114a for receiving a first type of substrate 1112a or one or more second load ports 1114b for receiving a second type of substrate 1112b. In some embodiments, the first type of substrates 1112a have a different size than the second type of substrates 1112b. In some embodiments, the second type of substrates 1112b include tape frame substrates or carrier substrates. In some embodiments, the second type of substrates 1112b include a plurality of dies/chiplets disposed on a tape frame or carrier plate. In some embodiments, the second type of substrates 1112b may hold different types and sizes of dies/chiplets. As such, the one or more second load ports 1114b may have different sizes or receiving surfaces configured to load the second type of substrates 1112b having different sizes. In some embodiments, the plurality of load ports 1114 are arranged along a common side of the EFEM 1102. Although FIG. 11 depicts a pair of the first load ports 1114a and a pair of the second load ports 1114b, the EFEM 1102 may include other combinations of load ports such as one first load port 1114a and three second load ports 1114b. In addition, the integrated hybrid bonding tool 1100 may also incorporate a buffer 1190 that provides temporary storage or buffering for sources and targets alike. The buffer 1190 aids in allowing different sizes/types of dies/chiplets to meet timing and other factors and/or constraints by making the targets and/or sources readily available for processing without requiring external retrieval.

In some embodiments, the EFEM 1102 includes a scanning station 1108 having substrate ID readers for scanning the one or more types of substrates for identifying information. In some embodiments, the substrate ID readers include a bar code reader or an optical character recognition (OCR) reader. The integrated hybrid bonding tool 1100 is configured to use any identifying information from the one or more types of substrates that are scanned to determine processing based on the identifying information, for example, different processes and/or placements for the first type of substrates 1112a and the second type of substrates 1112b. In some embodiments, the scanning station 1108 may also be configured for rotational movement to align the first type of substrates 1112*a* or the second type of substrates 1112*b*. In some embodiments, the one or more of the plurality of automation modules 1110 include a scanning station 1108. An EFEM robot 1104 is disposed in the EFEM 1102 and configured to transport the first type of substrates 1112*a* and the second type of substrates 1112*b* between the plurality of load ports 1114 to the scanning station 1108. The EFEM robot 1104 may include substrate end effectors for handling the first type of substrates 1112*a* and second end effectors for handling the second type of substrates 1112*b*. The EFEM robot 1104 may rotate or rotate and move linearly.

The transfer chamber 1116 includes a buffer 1120 configured to hold one or more first type of substrates 1112*a*. In some embodiments, the buffer 1120 is configured to hold one or more of the first type of substrates 1112*a* and one or more of the second type of substrates 1112*b*. The transfer chamber 1116 includes a transfer robot 1126 configured to transfer the first type of substrates 1112*a* and the second type of substrates 1112*b* between the buffer 1120, the one or more process chambers 1106, and a buffer disposed in an adjacent automation module of the plurality of automation modules 1110. For example, the transfer robot 1126 in the first automation module 1110*a* is configured to transfer the first type of substrates 1112*a* and the second type of substrates 1112*b* between the first automation module 1110*a* and the buffer 1120 in the second automation module 1110*b*. In some embodiments, the buffer 1120 is disposed within the interior volume of the transfer chamber 1116, advantageously reducing the footprint of the overall tool. In addition, the buffer 1120 can be open to the interior volume of the transfer chamber 1116 for ease of access by the transfer robot 1126.

The one or more process chambers 1106 may include atmospheric chambers that are configured to operate under atmospheric pressure and vacuum chambers that are configured to operate under vacuum pressure. Examples of the atmospheric chambers may generally include wet clean chambers, radiation chambers, heating chambers, inspection chambers, bonding chambers, or the like. Examples of vacuum chambers may include plasma activation chambers. The types of atmospheric chambers discussed above may also be configured to operate under vacuum, if needed. The one or more process chambers 1106 may be any process chambers or modules needed to perform a bonding process, a cleaning process, a radiation process, an inspection process (e.g., such as methods discussed above and below) or the like. In some embodiments, the one or more process chambers 1106 of each of the plurality of automation modules 1110 include at least one of a wet clean chamber 1122, a plasma activation chamber 1130, a degas chamber 1132, a radiation chamber 1134, an inspection chamber, or a bonder chamber 1140 such that the integrated hybrid bonding tool 1100 includes at least one wet clean chamber 1122, at least one plasma activation chamber 1130, at least one degas chamber 1132, at least one radiation chamber 1134, at least one inspection chamber, and at least one bonder chamber 1140. The one or more process chambers 1106 may be arranged in any suitable location of the integrated hybrid bonding tool 1100.

The wet clean chamber is configured to perform a wet clean process to clean the one or more types of substrates via a fluid, such as water. The wet clean chamber may include a first wet clean chamber 1122*a* for cleaning the first type of substrates 1112*a* and/or a second wet clean chamber 1122*b* for cleaning the second type of substrates 1112*b*. The degas chamber is configured to perform a degas process to remove moisture via, for example, a high temperature baking process. In some embodiments, the degas chamber includes a first degas chamber 1132*a* and/or a second degas chamber 1132*b*. The plasma activation chamber may be configured to perform an activation process on a substrate in preparation for hybrid bonding. The activation aids in increasing bonding strength between surfaces. In some embodiments, the plasma activation chamber includes a first plasma activation chamber 1130*a* and/or a second plasma activation chamber 1130*b*. The radiation chamber 1134 is configured to perform a radiation process to reduce adhesion between dies on a source such as, for example, a tape frame substrate or a carrier substrate with reconstituted dies. For example, the radiation chamber 1134 may be an ultraviolet radiation chamber configured to direct ultraviolet radiation at the source or a heating chamber configured to heat the source. The reduced adhesion between the dies and the source facilitates easier removal of the dies from the source. An inspection chamber 1118 can be used to inspect the source and target prior to bonding to detect any defects. The bonder chamber 1140 is configured to transfer and bond at least a portion of the dies from a source to the target. The bonder chamber 1140 generally includes a first support 1142 to support one of the first type of substrates 1112*a* and a second support 1144 to support one of the second type of substrates 1112*b*. An inspection chamber 1118 may be used post-bonding to inspect the bonded substrate or target to detect any defects resulting from the bonding.

In some embodiments, a last automation module of the plurality of automation module 1110, for example the third automation module 1110*c* of FIG. 11, includes one or more bonder chambers 1140 (two shown in FIG. 11). In some embodiments, any of the plurality of automation modules 1110 may include an inspection chamber 1118 configured to take measurements of the one or more types of substrates. In FIG. 11, the inspection chamber 1118 is shown as a part of the second automation module 1110*b* coupled to the transfer chamber 1116 of the second automation module 1110*b*. However, the inspection chamber 1118 may be coupled to any transfer chamber 1116 or within the transfer chamber 1116.

A controller 1180 controls the operation of any of the integrated hybrid bonding tools described herein, including the integrated hybrid bonding tool 1100. The controller 1180 may use a direct control of the integrated hybrid bonding tool 1100, or alternatively, by controlling the computers (or controllers) associated with the integrated hybrid bonding tool 1100. In operation, the controller 1180 enables data collection and feedback from the integrated hybrid bonding tool 1100 to optimize performance of the integrated hybrid bonding tool 1100 and to control the processing flow according to methods described herein such as using the inspection system to detect defects in target or source wafers, pre or post bonding. The controller 1180 generally includes a central processing unit (CPU) 1182, a memory 1184, and a support circuit 1186. The CPU 1182 may be any form of a general-purpose computer processor that can be used in an industrial setting. The support circuit 1186 is conventionally coupled to the CPU 1182 and may comprise a cache, clock circuits, input/output subsystems, power supplies, and the like. Software routines, such as methods as described herein may be stored in the memory 1184 and, when executed by the CPU 1182, transform the CPU 1182 into a specific purpose computer (controller 1180). The software routines may also be stored and/or executed by a second controller (not shown) that is located remotely from the integrated hybrid bonding tool 1100.

The memory 1184 is in the form of computer-readable storage media that contains instructions, when executed by the CPU 1182, to facilitate the operation of the semiconductor processes and equipment. The instructions in the memory 1184 are in the form of a program product such as a program that implements methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An inspection apparatus for detecting anomalies, comprising:

at least one time delay integrated (TDI) linear sensor that has a TDI linear sensor length, a TDI linear sensor optical input, and a TDI linear sensor data output; and a plurality of optical assemblies positioned adjacent to and spaced apart from each other, wherein each of the plurality of optical assemblies is positioned with an optical output focused on a segment of the TDI linear sensor length and an optical input with an input field-of-view (FOV) positioned to receive a portion of a surface under examination, wherein the optical assemblies are microscope bodies, and wherein each of the optical assemblies has a different focal plane.

2. The inspection apparatus of claim 1, wherein the TDI linear sensor length is approximately 80 mm.

3. The inspection apparatus of claim 1, further comprising:

a platform with an upper surface for supporting an object with the surface under examination and with a motion assembly configured to move the platform; and a controller in communication with the motion assembly to move the platform in relation to the optical input of the plurality of optical assemblies.

4. The inspection apparatus of claim 3, wherein the controller moves the platform to adjust a distance between the optical input and the surface under examination.

5. The inspection apparatus of claim 3, wherein the controller is in communication with the motion assembly, the plurality of optical assemblies, and the TDI linear sensor and is configured to scan an entire surface of a substrate.

6. The inspection apparatus of claim 5, wherein the substrate has chiplets bonded to the substrate.

7. The inspection apparatus of claim 3, wherein the controller is in communication with the motion assembly, the optical assemblies, and the TDI linear sensor and is configured to scan a carrier with singulated chiplets.

8. An inspection apparatus for detecting anomalies, comprising:

at least one time delay integrated (TDI) linear sensor that has a TDI linear sensor length, a TDI linear sensor optical input, and a TDI linear sensor data output;

a plurality of optical assemblies positioned adjacent to each other, wherein each of the plurality of optical assemblies is positioned with an optical output focused on a segment of the TDI linear sensor length and an optical input with an input field-of-view (FOV) positioned to receive a portion of a surface under examination;

a platform with an upper surface for supporting an object with the surface under examination and with a motion assembly configured to move the platform;

a controller in communication with the motion assembly to move the platform in relation to the optical input of the plurality of optical assemblies; and an integrated Z-profiler with a laser-based auto-focus module configured to determine a Z-profile of the surface under examination prior to acquisition of a surface image by the TDI linear sensor; or an external Z-profiler configured to provide a Z-profile of the surface under examination prior to acquisition of a surface image by the TDI linear sensor, wherein the external Z-profiler is in communication with the controller.

9. The inspection apparatus of claim 1, wherein the plurality of optical assemblies have a similar focus and FOV.

10. The inspection apparatus of claim 1, wherein at least one of the plurality of optical assemblies incorporates epi-illumination or darkfield illumination.

11. The inspection apparatus of claim 1, wherein at least one of the plurality of optical assemblies has a tunable lens that adjusts a focal plane of the at least one of the plurality of optical assemblies.

12. An inspection apparatus for detecting anomalies, comprising:

at least one time delay integrated (TDI) linear sensor that has a TDI linear sensor length of approximately 50 mm to approximately 160 mm, a TDI linear sensor optical input, and a TDI linear sensor data output;

a plurality of optical assemblies positioned adjacent to each other, wherein each of the plurality of optical assemblies is positioned with an optical output focused on a segment of the TDI linear sensor length and an optical input with an input field-of-view (FOV) positioned to receive a portion of a surface under examination;

a platform with an upper surface for supporting an object with the surface under examination and with a 4-axis motion assembly that moves the platform;

a controller in communication with the 4-axis motion assembly, the plurality of optical assemblies, and the TDI linear sensor and is configured to scan an entire surface of a substrate or a carrier; and a Z-profiler that determines a Z-profile of the surface under examination prior to acquisition of a surface image by the TDI linear sensor.

13. The inspection apparatus of claim 12, wherein the substrate has chiplets bonded to the substrate.

14. The inspection apparatus of claim 12, wherein the plurality of optical assemblies have a similar focus and FOV.

15. The inspection apparatus of claim 12, wherein at least one of the plurality of optical assemblies incorporates epi-illumination or darkfield illumination.

16. The inspection apparatus of claim 12, wherein at least one of the plurality of optical assemblies has a tunable lens that adjusts a focal plane of the at least one of the plurality of optical assemblies.

17. An inspection apparatus for detecting anomalies, comprising:

at least one time delay integrated (TDI) linear sensor that has a TDI linear sensor length of approximately 50 mm to approximately 160 mm, a TDI linear sensor optical input, and a TDI linear sensor data output;

a plurality of optical assemblies positioned adjacent to each other, wherein each of the plurality of optical assemblies is positioned with an optical output focused on a segment of the TDI linear sensor length and an optical input with an input field-of-view (FOV) positioned to receive a portion of a surface under examination;

a platform with an upper surface for supporting an object with the surface under examination and with a 4-axis motion assembly configured to move the platform;

a controller in communication with the 4-axis motion assembly, the plurality of optical assemblies, and the TDI linear sensor and is configured to scan an entire surface of a substrate or a carrier; and an integrated Z-profiler with a laser-based auto-focus module configured to determine a Z-profile of the surface under examination prior to acquisition of a surface image by the TDI linear sensor; or an external Z-profiler configured to provide a Z-profile of the surface under examination prior to acquisition of a surface image by the TDI linear sensor, wherein the external Z-profiler is in communication with the controller.

18. A method of obtaining inspection data, comprising:

determining a Z-profile of a surface of a substrate or carrier under examination prior to acquisition of a surface image;

scanning across the surface of the substrate or carrier with a plurality of optical assemblies positioned adjacent to each other;

receiving image data from the surface into the plurality of optical assemblies which is focused onto a single time delay integration (TDI) linear sensor, wherein each optical assembly focuses image data on a different portion of the TDI linear sensor;

reconstructing the image data from the TDI linear sensor to form reconstructed image data and mapping the reconstructed image data to a location on the surface;

analyzing the reconstructed image data and location data to determine locations of anomalies and form a defectivity map of the surface; and forming inferences based on the defectivity map and performing a corrective action based on the inferences.

19. The method of claim 18, wherein the corrective action includes marking chiplets as defective and removing the chiplets from a bonder selection pool.

20. The method of claim 18, wherein the corrective action includes augmenting a pre-bonding process to mitigate future anomalies.

* * * * *